United States Patent
Nguyen et al.

[11] Patent Number: 6,057,206
[45] Date of Patent: May 2, 2000

[54] MARK PROTECTION SCHEME WITH NO MASKING

[75] Inventors: Khanh B. Nguyen, Sunnyvale; Marina Plat, San Jose; Christopher F. Lyons, Fremont; Harry J. Levinson, Saratoga, all of Calif.

[73] Assignee: Advanced Micro Devices, Inc., Sunnyvale, Calif.

[21] Appl. No.: 09/410,526

[22] Filed: Oct. 1, 1999

[51] Int. Cl.⁷ .................................................. H01L 21/76
[52] U.S. Cl. ......................... 438/401; 438/462; 438/800
[58] Field of Search ................................... 438/401, 462, 438/800, 601; 257/797

[56] References Cited

U.S. PATENT DOCUMENTS

| | | |
|---|---|---|
| 4,732,785 | 3/1988 | Brewer . |
| 5,578,517 | 11/1996 | Yoo et al. ................................ 438/601 |
| 5,879,577 | 3/1999 | Weng et al. . |
| 5,923,996 | 7/1999 | Shih et al. ............................... 438/462 |
| 5,965,927 | 9/1998 | Lee et al. ................................. 257/529 |

OTHER PUBLICATIONS

"Product Lines", Tel Products, dated Jul. 16, 1999, from the Internet address: http://www.telusa,com/overview.html, 2 pages.

Primary Examiner—Charles Bowers
Assistant Examiner—Craig Thompson
Attorney, Agent, or Firm—Amin, Eschweiler & Turocy, LLP

[57] ABSTRACT

A method of forming an alignment mark protection structure is disclosed and includes forming an alignment mark protection layer over a substrate which has an alignment mark associated therewith. The method also includes forming a negative photoresist layer over the alignment mark protection layer and removing a portion of the negative photoresist layer which does not overlie the alignment mark. The removal exposes a portion of the alignment mark protection layer which does not overlie the alignment mark and the exposed portion of the alignment mark protection layer is then removed. Preferably, the removal of a portion of the negative photoresist includes selectively exposing a peripheral portion thereof using an edge-bead removal tool, thereby allowing for the formation of an alignment mark protection structure without an extra masking step.

11 Claims, 4 Drawing Sheets

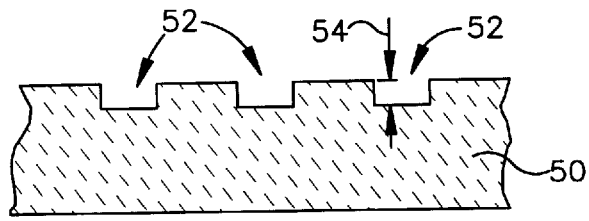
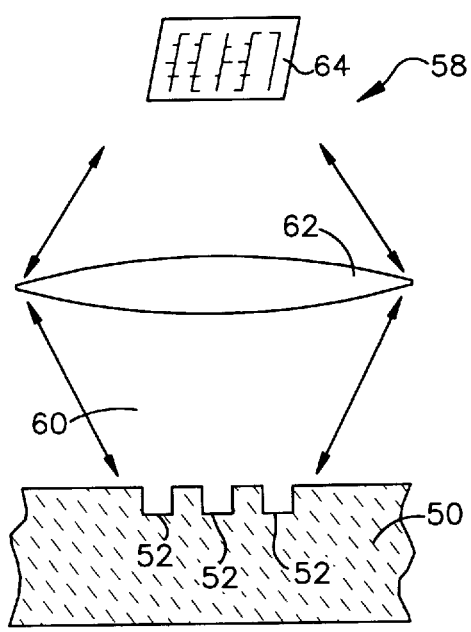
FIGURE 2
(PRIOR ART)
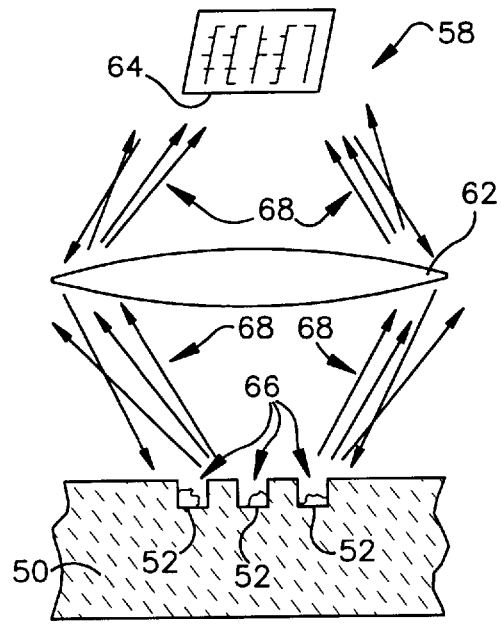
FIGURE 3
(PRIOR ART)
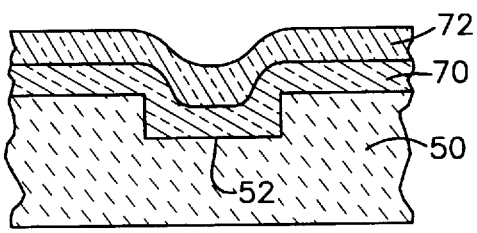
FIGURE 4a
(PRIOR ART)
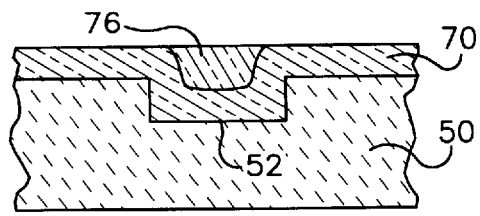
FIGURE 4b
(PRIOR ART)
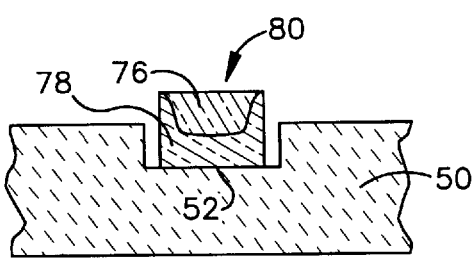
FIGURE 4c
(PRIOR ART)

MARK PROTECTION SCHEME WITH NO MASKING

FIELD OF THE INVENTION

The present invention generally relates to lithography and more particularly relates to a method of forming a structure for protecting alignment marks on a substrate. The method allows for the formation of the protection structure which protects the integrity of the alignments marks while minimizing the number of masking steps and allows for the use of an edge-bead removal tool instead of a stepper, thereby decreasing the processing cost and allowing for increased stepper throughput.

BACKGROUND OF THE INVENTION

In the semiconductor industry, there is a continuing trend toward higher device densities. To achieve these high densities there has been, and continues to be, efforts toward scaling down the device dimensions on semiconductor wafers. In order to accomplish such a high device packing density, smaller feature sizes are required. This may include the width and spacing of interconnecting lines and the surface geometry such as the corners and edges of various features.

The requirement of small features with close spacing between adjacent features requires high resolution photolithographic processes. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i.e., positive or negative resist). The soluble portions of the resist are then removed, thus leaving a photoresist mask corresponding to the desired pattern on the silicon wafer for further processing.

Clearly, projection lithography is a powerful and important tool for integrated circuit processing. In order to further increase the packing density of integrated circuits, however, not only is the quality of lithographic imaging important, but the accuracy with which an image can be positioned on the surface of a substrate is also of considerable importance. Because integrated circuits are fabricated by patterning a plurality of layers in a particular sequence to generate features that require a particular spatial relationship with respect to one another, each layer must be properly aligned with respect to previously patterned layers to minimize the size of individual devices and thus maximize the packing density on the substrate. Presently, having a perfect overlap (i.e., zero registration error) is not easily achievable. Consequently, a registration or overlay tolerance is required between two layers to ensure reliability in the construction of the resulting device. This registration or overlay tolerance undesirably increases the size of various structures and therefore attempts are made to minimize the tolerance.

As is evident from the discussion above, it is desirable to minimize the registration tolerance needed to form overlying patterns in order to improve the packing density of structures which form the integrated circuit. One solution which has been used to maximize the pattern overlay accuracy of various layers is to form one or more alignment marks or patterns on the underlying substrate and each mask. When the alignment marks or patterns on the substrate and mask are optically aligned, for example, then the remainder of the circuit patterns are assumed to be aligned.

Another type of alignment system uses an alignment mark scheme as illustrated in prior art FIG. 1, which illustrates a fragmentary cross section of a substrate such as a silicon wafer. A substrate 50 has one or more recesses 52 formed therein which serve as alignment marks. Each recess preferably has a depth 54 which is a function of the alignment radiation wavelength (e.g., a depth of $\lambda/4$). The predetermined depth 54 provides a destructive interference phenomena upon the reflection off the marks 52 which allows the alignment marks 52 to be more effectively "seen" (i.e., they exhibit a better reflective contrast than the neighboring non-recessed regions and are thus more visible).

An exemplary prior art alignment system 58 uses the alignment marks 52 of prior art FIG. 1 in the following manner, as illustrated in prior art FIG. 2. An alignment light source (not shown) illuminates a grating of alignment marks 52 with radiation 60 which has its diffracted orders reflect off the alignment marks 52 and get captured by a lens 62 and directed toward a mask 64. The reflected radiation 60 is used as a signal to detect the alignment between the mask 64 and the substrate 50.

As will become apparent in the discussion that follows, the prior art alignment mark structure suffers from some disadvantages which prevents alignment accuracy from being maximized. There is thus a need in the art for improved alignment structures and systems as well as efficient manufacturing methods for their implementation.

SUMMARY OF THE INVENTION

The present invention relates to a method of forming an alignment mark protection structure. The method allows for an efficient formation of the protection structure that avoids yield loss of semiconductor die which neighbor the protection structure due to a polish residue, thereby improving the semiconductor manufacturing process.

The method of the present invention includes the formation of one or more alignment mark protection structures without requiring an extra masking step in the manufacturing process. According to a preferred embodiment, an alignment mark protection layer is formed over the semiconductor wafer which contains one or more alignment marks associated therewith. A negative photoresist layer is then formed thereover and selectively exposed such that at least the regions of the negative photoresist which overlie the alignment marks are exposed to radiation. The unexposed portions are then removed and the remaining photoresist regions are employed as a mask to remove exposed portions of the alignment mark protection layer which is not covered by the photoresist.

According to a preferred embodiment of the present invention, the selective exposure of the negative photoresist is performed without a traditional masking step by using an edge-bead removal tool which is typically associated with a track system. Using the edge-bead removal tool, a tunable shield blocks radiation and permits a peripheral region of the negative photoresist about the wafer to be exposed. The peripheral region forms a concentric ring which preferably is only wide enough to cover the one or more alignment marks which are formed typically near the edge of the wafer. The unexposed photoresist (corresponding to a shape of the edge-bead removal shield) is then removed and the remaining photoresist ring is used as a mask to etch the underlying alignment mark protection film, thereby resulting in an alignment mark protection structure that forms a concentric ring about the periphery of the wafer. The use of the negative photoresist and the edge-bead removal tool allows for formation of the alignment mark protection structure without a traditional masking step and avoids use of the stepper, thereby improving stepper throughput.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a prior art fragmentary cross section of a substrate having a plurality of alignment marks therein;

FIG. 2 is a cross section diagram illustrating a prior art alignment system in an ideal situation, wherein no matter exists within an alignment mark, and how the alignment system uses an alignment light in conjunction with an alignment mark in the substrate to align the substrate with a mask for processing;

FIG. 3 is a prior art cross section diagram illustrating the alignment system of FIG. 2 in the absence of ideal conditions, wherein foreign matter resides in the alignment mark due to one or more processing steps, and how the existence of such foreign matter contributes to alignment error within the alignment system;

FIGS. 4a–4c are prior art fragmentary cross section diagrams illustrating how a series of processing steps may cause the formation of foreign matter within an alignment mark;

DETAILED DESCRIPTION OF THE INVENTION

Figure 5A:
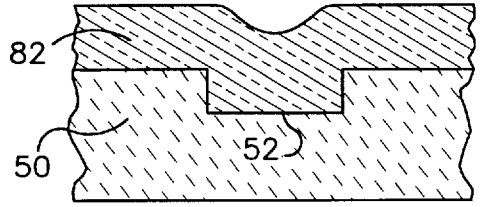
FIGS. 5a–5b are prior art fragmentary cross section diagrams illustrating how another series of processing steps may cause the formation of foreign matter within an alignment mark.

The present invention generally relates to a method of forming an alignment mark protection structure. In particular, the method provides for an alignment mark protection structure that eliminates yield problems associated with polish residue caused by the alignment mark protection structure, wherein the method is operable to provide such advantages without a masking step or use of the stepper. Consequently, the method of the present invention prevents yield loss without the cost associated with an extra masking step. In addition by not using the stepper, the method allows for increased stepper throughput.

In order to properly appreciate the context in which the present invention operates a brief description of the alignment mark protection structure and the problems associated therewith will be discussed. Then the method of the present invention will be disclosed.

In prior art alignment systems such as those illustrated in prior art FIGS. 1 and 2 having traditional alignment mark structures 52, several drawbacks exist which result in a degradation in alignment accuracy.

For example, if foreign matter 66 resides within one or more of the alignment marks 52, as illustrated in prior art FIG. 3, the alignment light radiation 68 which reflects off of the alignment marks 52 contains noise due to the foreign matter 66 within the alignment marks 52 and results in a significant amount of noise in the reflected diffracted orders. This noise is captured by the lens 62 and imaged back toward the mask 64 and the noisy image causes the alignment accuracy to diminish substantially.

Foreign matter 66, such as that illustrated in prior art FIG. 3, can form within the alignment marks 52 in a variety of ways. For example, as illustrated in prior art FIGS. 4a–4c, a series of deposition and processing steps may result in matter undesirably being left in one or more of the alignment marks 52. As illustrated in prior art FIG. 4a, the semiconductor process may dictate the formation of a blanket nitride film deposition followed by an oxide film formation, thus forming films 70 and 72, respectively. Due to the conformal nature of the film layers 70 and 72, if a subsequent chemical-mechanical polish (CMP) step or other type film removal process is performed to remove the oxide film 72 in the region local to the alignment marks 52, as illustrated in prior art FIG. 4b, a portion 76 of the oxide film 72 may remain over the one or more alignment marks 52. If the nitride film 70 is then stripped away in the region local to the alignment marks 52 in order to enable the alignment system 58 to "see" the alignment marks 52 for a subsequent mask step, the oxide film portion 76 masks a portion 78 of the nitride film 70 within the one or more alignment marks 52, thus undesirably resulting in a residual hillock-type structure 80 therein, as illustrated in prior art FIG. 4c. Therefore when the alignment system 58 transmits the alignment light radiation onto the alignment marks 52, noise is produced by the hillock 80 and exists within the reflected light radiation. Consequently, this modifies the apparent position of the alignment marks seen by the alignment system which consequently results in a degradation in alignment accuracy and a corresponding increase in pattern registration error.

Figure 5B:
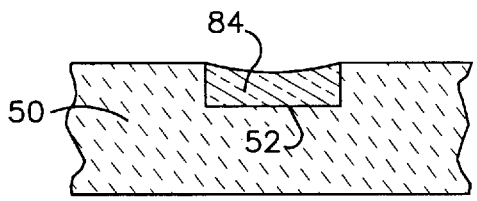

Likewise, other types of nonuniform depositions or formations within the alignment marks 52 can cause similar degradation in registration accuracy. For example, as illustrated in prior art FIGS. 5a and 5b, if a film such as an oxide film 82 is deposited or otherwise formed over the substrate 50, as illustrated in prior art FIG. 5a, and then polished back, a portion 84 of the oxide film 82 is not flush with the substrate 50 as would be expected in an ideal process, but rather is gouged slightly to form an asymmetric structure 82 within the alignment marks 52. In addition, the asymmetric shape of the remaining oxide portion 84 is not uniform, repeatable or substantially controllable. Such mark variations undesirably result in a degradation in alignment accuracy.

In order to address the above problems, an alignment mark protection structure has been developed. Such an alignment mark protection structure and an associated alignment system is disclosed below. The structure protects one or more alignment marks from process-induced damage, and thus ensures alignment accuracy for multiple process steps and thereby minimizes registration error between various layers in one or more structures being fabricated.

The alignment mark protection structure includes a cap overlying the one or more alignment marks. The cap is substantially transparent with respect to a wavelength of an alignment light used in the alignment process. Consequently, the one or more underlying alignment marks can be seen by an alignment system through the cap. The cap protects the one or more alignment marks by preventing foreign matter from being formed therein and thus eliminates errors associated with such matter during multiple processing steps. In addition, although the cap itself endures damage on its exposed surfaces due to the various processing steps (e.g., pock marks, scratches, rounded edges, etc.), such cap defects are out of focus with respect to the alignment system and thus do not substantially impact the alignment accuracy. Using the alignment mark protection structure, alignment error due to process-induced damage associated with the one or more alignment marks is eliminated, thus maintaining high alignment accuracy through an entire process flow. Consequently, registration errors for overlying layers may be minimized, thus increasing the packing density for multiple devices on the substrate.

Figure 6A:
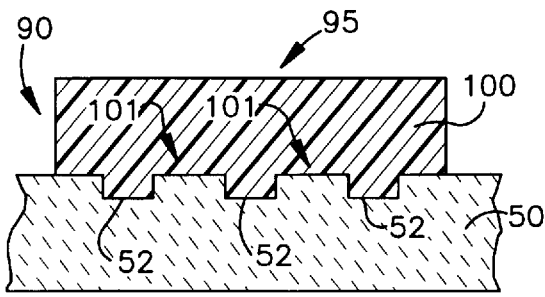
FIG. 6a is a fragmentary cross section diagram illustrating an alignment mark protection structure including a cap overlying a plurality of alignment marks.

Referring now to the Figures, FIG. 6a is a fragmentary cross section diagram illustrating a portion 90 of the substrate 50 having an alignment mark protection structure 95. The portion 90 of the substrate 50 includes a plurality of alignment marks 52 therein, similar to the alignment marks 52 of prior art FIG. 1. The alignment mark protection structure 95 includes a cap 100 which overlies the alignment marks 52. The cap 100 serves to protect the alignment marks during subsequent processing of the substrate 50. Consequently, the integrity of the alignment marks 52 is maintained throughout the entire process flow (e.g., a standard CMOS flow, a flash memory process flow, etc.) which allows for high alignment accuracy to be maintained for each step in the process.

The cap 100 is formed of a material which is substantially transparent with respect to an alignment light utilized in the alignment process. For example, for an alignment light source having a wavelength of 6,328 Angstronms (i.e., about 632 nn). materials such as silicon dioxide ($SiO_2$) or silicon nitride ($Si_3N_4$) may be used. Alternatively, however, other materials which are substantially transparent with respect to the alignment light may be used and such materials are contemplated. In the above manner, the alignment marks 52 may still be sufficiently "seen" by the alignment system despite the presence of the cap 100.

Preferably, the cap 100 exhibits an alignment light absorption of about 50 percent or less and more preferably an absorption of about 25 percent or less. Note that the absorption sufficiency of the cap 100 is difficult to characterize because the acceptable cap absorption (i.e., substantially transparent) is a function of the quality of the alignment system. Typically, the absorption of the cap 100 needs to have a signal-to-noise ratio which is sufficient to let the alignment system operate repeatably. Such desired repeatability may be obtained if the return signal (the diffracted orders) is 5% of what would be reflected if the alignment light had reflected off of a silicon surface. Therefore the thickness of the cap 100 is preferably selected to provide a sufficient transparency with respect to the alignment light while simultaneously being sufficiently thick to adequately protect the alignment marks 52 throughout the entire process flow. For example, the cap 100 is preferably $SiO_2$ having a thickness of about 2,000 Angstroms, but may vary substantially, for example, between about 1,000 Angstroms and about 50,000 Angstroms. At this thickness, the cap 100 exhibits an absorption of about 10% and is thus substantially transparent.

As discussed above, the alignment marks 52 of FIG. 6a exhibit recesses within the substrate 50. Preferably, the recesses have a rectangular cross section having a depth which provides an optical contrast with its neighboring regions 101 (e.g., a depth of $\lambda/4$, wherein the $\lambda$ is the wavelength of the alignment light). Alternatively, however, the alignment marks can be constructed in a variety of different cross sectional shapes and any such modification is contemplated.

Preferably, the portion 90 of the substrate 50 containing the alignment marks 52 is located in a non-active portion of the substrate 50, that is, a portion not containing active devices such as transistors, capacitors, resistors, etc. For example, such a region 90 may exist within a scribe line between various die on a semiconductor wafer. Consequently, the alignment mark protection structure 95 does not adversely effect the die size of the device being fabricated. Alternatively, however, the alignment mark protection structure 95 of the present invention may be located at any location of the substrate and may exist for each die on the substrate or only a single such structure 95 (or a plurality of such structures) may exist on the entire substrate 50, as may be desired. In addition, although FIG. 6a illustrates a plurality of alignment marks 52, the present invention may also be applied to a single alignment mark.

Figure 6B:
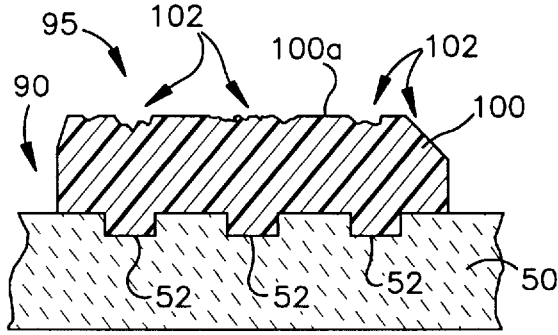
FIG. 6b is a fragmentary cross section diagram illustrating the alignment mark protection structure of FIG. 6a, wherein the cap includes a plurality of damage sites due to process-induced damage.
Figure 7:
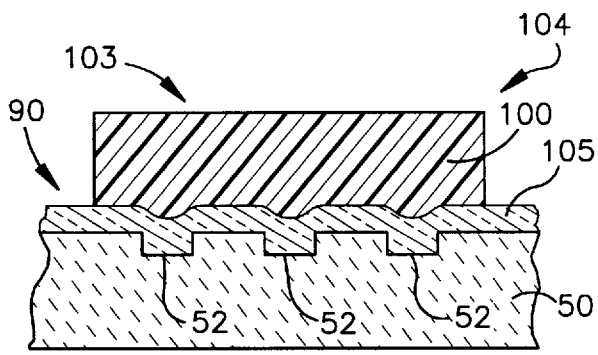
FIG. 7 is a fragmentary cross section diagram illustrating an alternative alignment mark protection structure.

During execution of the process flow, various layers are blanket deposited and patterned, stripped, polished, etc. over the surface of the substrate 50 and thus interact with the alignment mark protection structure 95. For example, conductive layers, photoresist layers, etc. are deposited, patterned, stripped or polished to effectuate the formation of the desired structures on and in the substrate 50. Such processing steps result in a substantial amount of damage or defects 102 on a surface 100a of the cap 100, as illustrated in FIG. 6b. Such defects 102 may include pock marks, scratches, rounding of the edges, thinning of the cap 100, etc. The defects 102, however, are a substantial distance away from the alignment marks 52 (i.e., about a distance equal to the thickness of the cap 100) and are of a random nature and thus can be easily filtered out of the reflected diffracted orders. Consequently, the cap 100, even though it endures process-induced damage 102, protects the alignment marks 52 and allows the marks 52 to be clearly seen by the alignment system despite the presence of defects 102 on its exposed surface 100a.

Figure 9:
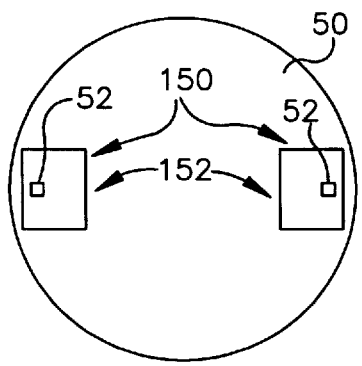
FIG. 9 is a plan view of a semiconductor wafer having alignment mark protection structures formed thereon.
Figure 8:
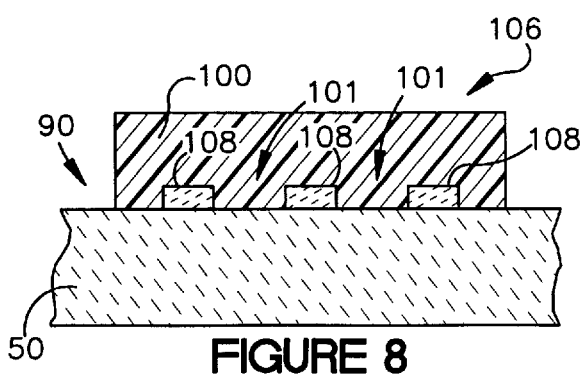
FIG. 8 is a fragmentary cross section diagram illustrating another alternative alignment mark protection structure.

Previously, when a single pair of alignment marks were used for alignment of the stepper across the wafer, the fabrication of the alignment mark protection structure or cap proceeded as follows, as illustrated in FIG. 9. Initially, an alignment mark protection film, followed by a positive photoresist film, is deposited across the entire wafer. The stepper then steps across the wafer and performs a blanket exposure at each step location thereacross, with the exceptions of regions 150 where the alignment marks 52 are located. At these locations 150 (corresponding to an exposure field of the stepper) no exposure occurs. Since the photoresist is a positive resist, upon development and removal the entire photoresist is gone except for at the unexposed regions 150. An etch step is then performed, using the remaining photoresist as a mask, to remove the alignment mark protection film from all portions of the wafer except for at the regions 150 which contain the alignment marks 52, thereby forming the alignment mark protection structures 100. The remaining photoresist is then stripped.

Although the above process is effective in forming the alignment mark protection structure or cap 100 over the alignment marks, such a structure 100 causes potential yield problems with respect to subsequent chemical-mechanical polishing (CMP) steps which may be performed in the semiconductor manufacturing process. The potential problem stems from the size of the alignment mark protection structure. For example, the protection structure is substantially tall (i.e., the Z dimension), being about 0.5 $\mu$m high or more, thus creating a significant "step" between the cap structure 100 and the neighboring fields 152 containing semiconductor die. In addition, since the size of the structure 100 in the X-Y plane is defined by the size of an entire exposure field of the stepper, the structure 100 can be about 22 mm×22 mm (for a particular stepper design). In stark contrast, the underlying alignment marks 52 themselves are only about 2 mm×2 mm. Consequently, the cap 100 is substantially larger than needed and abuts neighboring fields 152. The large step between the protection structure 100 and a neighboring exposure field has the potential to cause a yield problem, as illustrated in FIGS. 10a-10e.

Figure 10A:
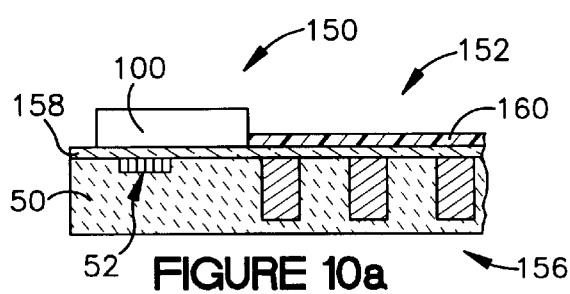
FIGS. 10a–10d are fragmentary cross section diagrams of a peripheral portion of a semiconductor wafer illustrating how the large step of the alignment mark protection structure can cause a polish residue to form which impacts device yield on the wafer.
Figure 10E:
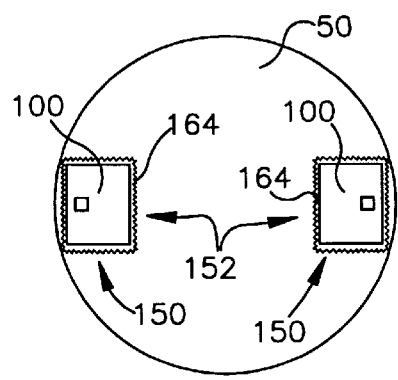
FIG. 10e is a plan view of a semiconductor wafer having alignment mark protection structures formed thereon with polish residues along a peripheral edge of the alignment mark protection structure.

In FIG. 10a, a portion 150, 152 of the wafer 50 comprising two neighboring stepper exposure fields is illustrated, wherein the portion 150 contains an alignment mark 52 therein. Also in the wafer substrate 50, in the neighboring region 152 are various structures 156 which correspond to portions of the integrated circuit being manufactured therein. An interface layer 158, for example, is formed over the entire substrate 50 and the alignment mark protection structure 100 is formed in the region 150 (as discussed supra) while a second film 160 (e.g., a polysilicon film) is formed in the region 152. In accordance with the semiconductor manufacturing process, a CMP step is performed to remove the film 160.

Figure 10B:
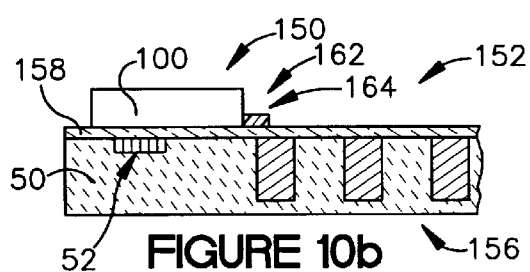
Figure 10C:
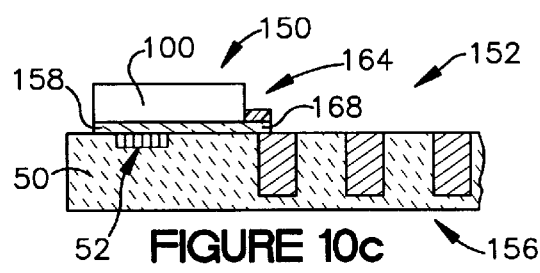
Figure 10D:
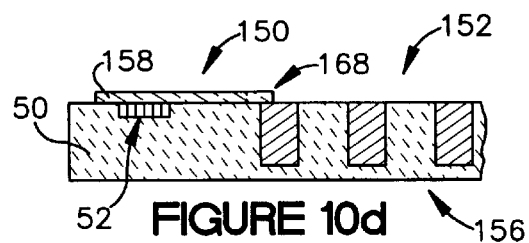

As illustrated in FIG. 10b, because the alignment mark protection structure 100 is so tall, the step 162 between the structure 100 and the film 160 makes it difficult to remove a portion of the film 160 adjacent the step 162 via the CMP process, thereby resulting in a small piece of film residue 164 remaining in the region 152 which is adjacent the protection structure 100. Later, when the interface layer 158 is removed via, for example, etching, the film residue 164 acts as a mask to shield a portion of the interface layer 168, as illustrated in FIG. 10c. Consequently, even after a masking layer strip, as illustrated in FIG. 10d, the residual interface layer 168 remains on the wafer 50 in the region 152 and may overlie a portion of the structures 156 therein. Such an overlie may cause the die in the region 152 to be defective, thus causing a yield reduction on the wafer 50. The manner in which the residue 164 "borders" the protective structure 100 may best be seen in the plan view of FIG. 10e.

Figure 11A:
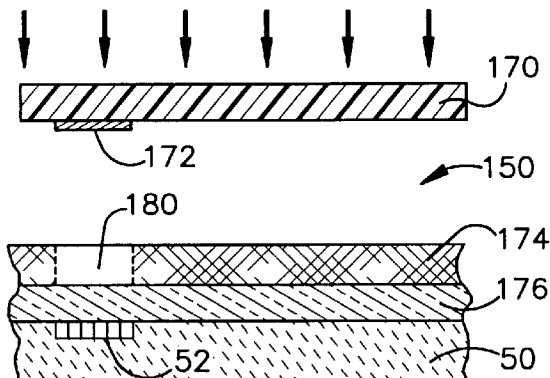
FIGS. 11a–11c are fragmentary cross section diagrams illustrating a method of eliminating the polish residue of FIG. 10e using an extra masking step.
Figure 11B:
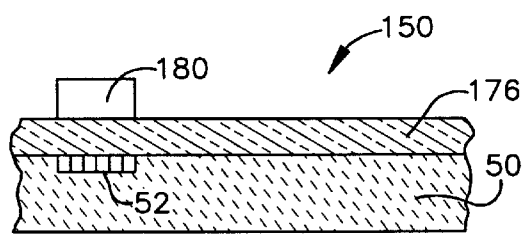
Figure 11C:
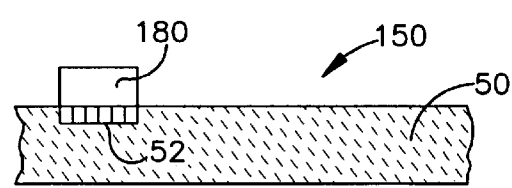

The solution provided to eliminate the residue 164 caused by the protection structure 100 is illustrated in FIGS. 11a-11c. FIG. 11a is a fragmentary cross section illustrating the region 150 of the substrate 50 corresponding to an exposure field of the stepper which contains an alignment mark 52. In order to eliminate the possibility of the undesirable residue 164 from impacting neighboring regions 152, the size of the protection structure 100 is reduced in the X-Y dimensions using an extra mask step. For example, a mask 170 containing a chrome pad 172 which generally corresponds to the alignment mark 52 is used to expose a positive photoresist 174 which overlies an alignment mark protection film 176.

Upon exposure, the mask 170 shields a portion 180 of the photoresist 174 over the alignment mark 52. Consequently, upon development and removal of the photoresist 174, only the unexposed portion 180 of the photoresist overlying the alignment mark 52 remains, as illustrated in FIG. 11b. The portion 180 then serves as a mask during the subsequent etching of the alignment mark protection film 176 to form the protection structure 100 which only covers the alignment mark 52 as opposed to the entire region 150, as illustrated in FIG. 11c.

The solution illustrated in FIGS. 11a-11c eliminates the problem of polish residue overlying neighboring regions 152. Although the polish residue still exists during processing, because the protection structure 100 is now approximately the size of the alignment mark 52 (e.g., about 2 mm×2 mm) instead of the entire exposure field (e.g., about 22 mm×22 mm), the polish residue that exists about the structure 100 is confined well within the region 150 and does not overlap into neighboring regions 152 where semiconductor die structures are manufactured. The solution of FIGS. 11a-11c is effective at resolving potential yield loss due to the protection structure 100. The solution, however, does require an extra mask step and requires use of the stepper. Thus it is desirable to overcome the problem of polish residue impacting die yield without utilizing the expensive solution of an extra masking step.

The present invention overcomes the limitations of the above noted alignment mark protection structure formation processes by forming the structures 100 without the use of an extra masking step and without use of the stepper. Therefore the present invention decreases the cost of manufacture both by reducing the number of mask steps and increasing the throughput of the stepper.

Figure 12A:
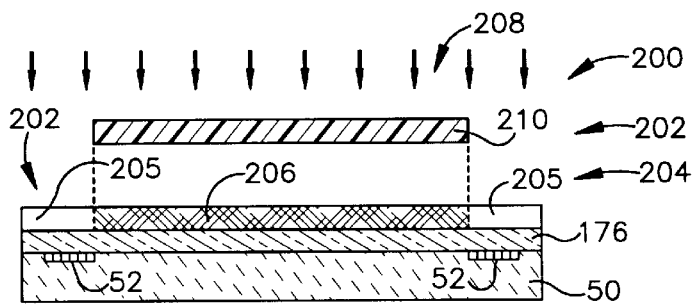
FIGS. 12a–12c are cross section diagrams illustrating a method of eliminating potential yield loss due to polish residue without use of an extra masking step or use of the stepper according to the present invention.
Figure 12B:
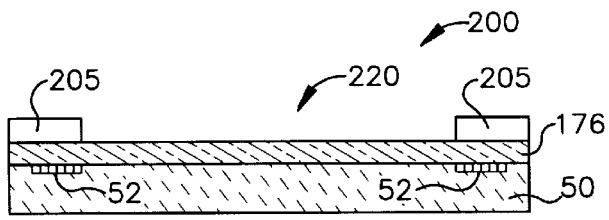
Figure 12C:
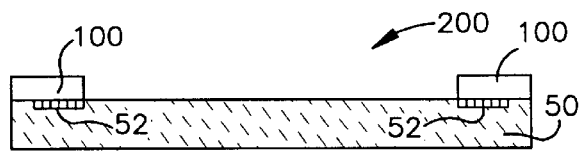

A method 200 of manufacturing an alignment mark protection structure 100 without a masking step according to an exemplary embodiment of the present invention is illustrated in FIGS. 12a-12c. In FIG. 12a, the entire wafer substrate 50 is illustrated having alignment marks 52 formed therein at peripheral portions 202 thereof. An alignment mark protection layer 176 is then formed over the substrate 50 via any conventional film formation process, for example, deposition, growth etc. The layer 176 can be any type of film that is substantially transparent with respect to an alignment light, as discussed supra. In addition, although FIG. 12a illustrates the layer 176 directly overlying the substrate 50, one or more interface layers may be disposed between the layer 176 and the substrate 50, as discussed supra.

Further, as illustrated in FIG. 12a, a negative photoresist layer 204 is formed over the alignment mark protection layer 176 via. for example, spin-coating. Any form of negative photoresist may be used and is contemplated as falling within the scope of the present invention. After the negative photoresist layer 204 has been formed, the negative photoresist is selectively exposed in a manner such that the peripheral portions 202 of the wafer 50 and thus peripheral portions of the photoresist 204 are exposed, as designated by reference numeral 205. As is well known, with a negative photoresist, those portions 205 which are exposed to radiation remain insoluble upon development while regions 206 which are not exposed become insoluble after such development takes place.

Any manner of selectively exposing the negative photoresist layer 176 may be used and is contemplated as falling within the scope of the present invention. According to a preferred embodiment of the present invention, the selective exposure is accomplished without a masking step and without use of the stepper, thereby reducing the processing costs considerably. Preferably, the maskless exposure is accomplished using a track system such as the family of CLEAN TRACK® systems manufactured by Tokyo Electron Limited, Inc. in Tokyo, Japan. Such track systems are used in the various modes of photoresist processing. In particular, the edge-bead removal unit subsystem is used.

A portion of an edge-bead removal unit 208 is illustrated in FIG. 12a. The unit includes an illumination source (not shown) and a shield 210 which is generally disk-shaped and is disposed between the illumination source and the substrate 50. The shield 210 is smaller than the size of the wafer 50, therefore the illumination source exposes the peripheral portion 202 of the substrate 50. The size of the shield 210 is generally tunable to thereby allow the peripheral portion of the photoresist 205 which is exposed to be as large or as small as desired. Preferably, the exposed peripheral portion 205 is only large enough to completely expose the portion of the negative photoresist layer 204 which overlies the alignment marks 52 in the substrate 50. Use of the edge-bead removal unit 208 within the track system allows for the selective exposure of the negative photoresist layer without a masking step and without use of the stepper. Consequently, during the selective exposure process, the stepper can be used for other processing tasks, thereby advantageously increasing the stepper throughput.

After the selective exposure, the negative photoresist layer 204 is developed and the unexposed portion 206 thereof is removed, which results in the structure illustrated in FIG. 12b. In particular, what remains is the peripheral regions 205 of the exposed negative photoresist. Although FIG. 12b illustrates the regions 205 disconnected in cross section, it should be appreciated that the regions 205 preferably connect together and form a continuous peripheral ring about the peripheral portion of the wafer 50. As illustrated in FIG. 12b, the remaining photoresist 205 serves as a mask and allows for the removal of the exposed alignment mark protection layer 176 in the inner region 220 as defined by the regions 205.

Figure 13:
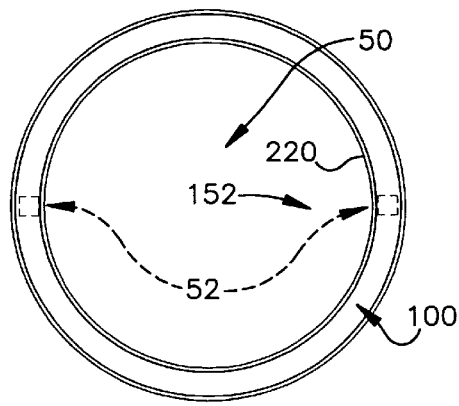
FIG. 13 is a plan view of a semiconductor wafer having an alignment mark protection structure formed according to the method of the present invention.

The exposed alignment mark protection layer 176 in the exposed inner region 220 is then removed using conventional processing techniques, for example, etching, and the negative photoresist regions 205 are then stripped, as illustrated in FIG. 12c, thereby forming the alignment mark protection structure 100. The protection structure 100, however, differs slightly from the distinct square or rectangular-type structure highlighted in FIG. 9. Instead, the protection structure 100 formed by the method 200 preferably forms a concentric ring about the periphery of the wafer 50, as illustrated in FIG. 13 Note that in FIG. 13, the protection structure 100 covers the alignment marks 52, thereby providing the desired protection. However, the structure 100 does not substantially encroach on neighboring exposure fields 152 where semiconductor die are manufactured. Therefore any CMP residue which may reside along an inner peripheral edge 220 of the structure 100 will not overlap into the neighboring regions 152 and thus will not adversely impact die area.

Figure 14:
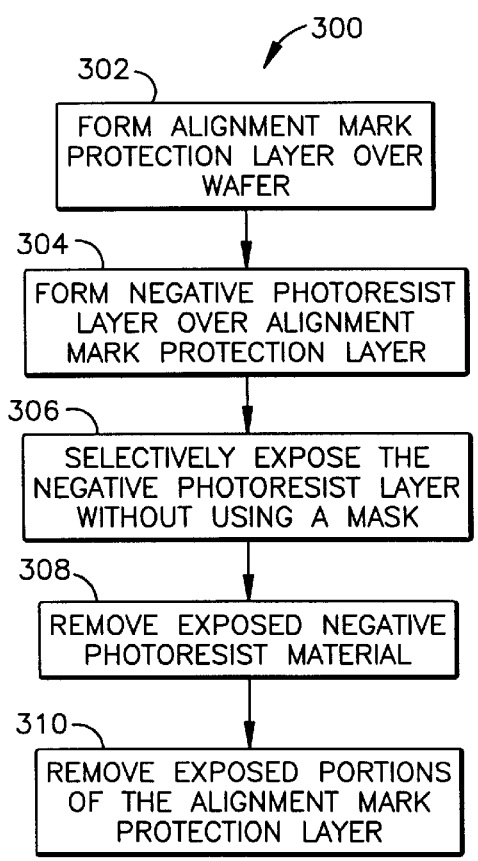
FIG. 14 is a flow chart illustrating a method of forming an alignment mark protection structure according to the present invention.

The method 200 of FIGS. 12a–12c constitute one exemplary embodiment of the present invention. Alternatively, however, the method of the present invention may be characterized more broadly, as illustrated in the how chart of FIG. 14 and designated by reference numeral 300. The method 300 of forming an alignment mark protection structure begins by forming an alignment mark protection layer over the wafer, thereby covering the one or more alignment marks at step 302. Any manner of forming the alignment mark protection film may be utilized and is contemplated as falling within the scope of the present invention. For example, a spin-on technique, a film deposition process such as CVD (chemical vapor deposition), or growth process, etc. may be utilized.

The method 300 continues by forming a negative photoresist layer over the alignment mark protection layer at step 304. Similarly, any manner of forming the negative photoresist layer over the alignment mark protection layer may be utilized and is contemplated as falling within the scope of the present invention. The negative photoresist layer is then selectively exposed without using a mask at step 306. In particular, the selective exposure corresponds to exposing at least the portion of the negative photoresist overlying the alignment marks. Any manner of selectively exposing the negative photoresist in the above manner may be used and is contemplated as falling within the scope of the present invention. For example, such a selective exposure may be accomplished using an edge-bead removal tool which selectively exposes an outer periphery of the negative photoresist without use of a mask. Therefore the method 300 does not require an additional masking step.

The portion of the negative photoresist layer which were not exposed at step 306 is then removed at step 310 and the underlying exposed portions of the alignment mark protection layer are then removed at step 310 using the remaining selective exposed negative photoresist as a mask. The removal of the exposed portions of the alignment mark protection layer result in the definition of the alignment mark protection structures which overlie the alignment marks. In the above manner, the alignment mark protection structures are formed without potential yield loss due to CMP residues without requiring an additional mask step.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming an alignment mark protection structure, comprising the steps of:
    forming an alignment mark protection layer over a substrate, the substrate having an alignment mark associated therewith;
    forming a negative photoresist layer over the alignment mark protection layer;
    removing a portion of the negative photoresist layer which does not overlie the alignment mark, thereby exposing a portion of the alignment mark protection layer which does not overlie the alignment mark; and
    removing the exposed portion of the alignment mark protection layer.

2. The method of claim 1, wherein the alignment mark protection layer comprises a material which is substantially transparent with respect to alignment radiation, and wherein forming the alignment mark protection layer comprises depositing a film over the substrate.

3. The method of claim 1, wherein the alignment mark protection layer comprises a material which is substantially transparent with respect to alignment radiation, and wherein forming the alignment mark protection layer comprises growing a film over the substrate.

4. The method of claim 1, wherein the alignment mark protection layer comprises a silicon dioxide film or a silicon nitride film, and wherein a thickness of the alignment mark is such that it exhibits an alignment radiation absorption of about fifty percent or less.

5. The method of claim 1, wherein forming a negative photoresist film over the alignment mark protection layer comprises the steps of:
    depositing a negative photoresist material on the alignment mark protection layer; and
    rotating the substrate, wherein the substrate rotation spreads the negative photoresist material substantially uniformly across a surface of the alignment mark protection layer.

6. The method of claim 1, wherein the alignment mark is associated with an edge portion of the substrate and wherein removing the portion of the negative photoresist which does not overlie the alignment mark comprises the steps of:
    selectively exposing an edge portion of the negative photoresist, wherein the edge portion of the negative photoresist generally corresponds with the edge portion of the substrate having the alignment mark associated therewith;
    developing the selectively exposed negative photoresist, wherein the development causes exposed portions to become generally insoluble and unexposed portions to become generally soluble; and
    removing the soluble portions of the developed negative photoresist, thereby exposing the portion of the alignment mark protection layer which does not overlie the alignment mark.

7. The method of claim 1, wherein the alignment mark is associated with an edge portion of the substrate, and wherein removing the portion of the negative photoresist which does not overlie the alignment mark comprises the steps of:
    placing the substrate having the negative photoresist layer thereon in an edge-bead removal tool;
    selectively exposing a periphery of the negative photoresist layer, wherein the periphery of the negative photoresist overlies the edge portion of the substrate having the alignment mark associated therewith;
    developing the selectively exposed negative photoresist, wherein the development causes exposed portions to become generally insoluble and unexposed portions to become generally soluble; and
    removing the soluble portions of the developed negative photoresist, thereby exposing a portion of the alignment mark protection layer which does not overlie the alignment mark.

8. The method of claim 1, wherein removing the exposed portion of the alignment mark protection layer comprises etching the exposed portion of the alignment mark protection layer using a remaining portion of the negative photoresist layer as a mask.

9. A method of forming an alignment mark protection structure overlying an alignment mark which is associated with a region near an edge of a substrate, comprising the steps of:
    forming an alignment mark protection layer which is substantially transparent with respect to an alignment mark over a substrate, wherein the substrate has one or more alignment marks associated therewith;
    forming a negative photoresist layer over the alignment mark protection layer;
    selectively exposing a peripheral portion of the negative photoresist layer, wherein the peripheral portion overlies the one or more alignment marks;
    removing unexposed portions of the negative photoresist layer;
    selectively removing portions of the alignment mark protection layer generally corresponding to the removed unexposed portions of the negative photoresist layer, wherein a remaining portion of the alignment mark protection layer forms the alignment mark protection structure.

10. The method of claim 9, wherein selectively exposing the peripheral portion of the negative photoresist layer comprises the steps of:
    inserting the substrate having the negative photoresist layer thereon into an edge-bead removal tool;
    positioning a generally disk-shaped radiation shield between the substrate and a radiation source; and
    illuminating the negative photoresist layer on the substrate with the radiation source, wherein the disk-shaped radiation shield blocks a portion of the radiation from illuminating a central portion of the negative photoresist, thereby causing the illumination of the negative photoresist to occur along a peripheral portion thereof.

11. The method of claim 10, further comprising the step of tuning a size of the disk-shaped radiation shield, thereby allowing for modification of a size of the exposed peripheral region of the negative photoresist layer.

* * * * *

UNITED STATES PATENT AND TRADEMARK OFFICE
CERTIFICATE OF CORRECTION

PATENT NO.: 6,057,206

DATED: May 2, 2000

INVENTOR(S): Khanh B. Nguyen
Marina Plat
Christopher F. Lyons
Harry J. Levinson

It is certified that error appears in the above-identified patent and that said Letters Patent is hereby corrected as shown below:

Column 6, line 3, please replace "." with --,--.

Column 7, line 50, please replace "10a10e" with --10a-10e--.

Column 9, line 12, please replace "." with --,--.

Column 10, line 23, please replace the word "how" with the word --flow--.

Signed and Sealed this

Twentieth Day of February, 2001

*Attest:*

NICHOLAS P. GODICI

*Attesting Officer*   *Acting Director of the United States Patent and Trademark Office*